(12) United States Patent
Tasic et al.

(10) Patent No.: US 8,102,213 B2
(45) Date of Patent: Jan. 24, 2012

(54) MULTI-MODE LOW NOISE AMPLIFIER WITH TRANSFORMER SOURCE DEGENERATION

(75) Inventors: Aleksandar Tasic, San Diego, CA (US); Junxiong Deng, San Diego, CA (US); Zhang Jin, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 47 days.

(21) Appl. No.: 12/565,526

(22) Filed: Sep. 23, 2009

(65) Prior Publication Data

US 2011/0018635 A1 Jan. 27, 2011

Related U.S. Application Data

(60) Provisional application No. 61/227,941, filed on Jul. 23, 2009.

(51) Int. Cl.
*H03G 3/12* (2006.01)
(52) U.S. Cl. .......................... 330/283; 330/311; 330/295
(58) Field of Classification Search .................. 330/283, 330/311, 295, 305
See application file for complete search history.

(56) References Cited

U.S. PATENT DOCUMENTS

| | | | | |
|---|---|---|---|---|
| 6,026,286 A * | 2/2000 | Long | .............................. | 455/327 |
| 7,081,796 B2 * | 7/2006 | Krone | ............................ | 330/254 |
| 7,098,737 B2 * | 8/2006 | Fujimoto et al. | ............. | 330/283 |
| 7,605,655 B2 * | 10/2009 | Kim et al. | ...................... | 330/253 |
| 7,622,989 B2 * | 11/2009 | Tzeng et al. | ................... | 330/126 |
| 7,737,783 B2 * | 6/2010 | Yamaguchi | ..................... | 330/260 |
| 2004/0066236 A1 | 4/2004 | Fujimoto et al. | | |
| 2005/0176399 A1 | 8/2005 | Aparin | | |
| 2009/0174481 A1 | 7/2009 | Chang | | |
| 2010/0103572 A1 * | 4/2010 | Worley | ........................... | 361/56 |

OTHER PUBLICATIONS

International Search Report and Written Opinion—PCT/US2010/043153—International Searching Authority, European Patent Office, Oct. 15, 2010.

* cited by examiner

*Primary Examiner* — Patricia Nguyen
(74) *Attorney, Agent, or Firm* — Ramin Mobarhan

(57) ABSTRACT

A multi-mode low noise amplifier (LNA) with transformer source degeneration is described. In an exemplary design, the multi-mode LNA includes first, second, and third transistors and first and second inductors. The first transistor has its source coupled to the first inductor, amplifies an input signal, and provides a first amplified signal in a first mode. The second transistor has its source coupled to the second inductor, amplifies the input signal, and provides a second amplified signal in a second mode. The third transistor has its source coupled to the second inductor. The first and third transistors receive the input signal and conduct current through the first and second inductors, respectively, in a third mode. The first transistor observes source degeneration from a transformer formed by the first and second inductors, amplifies the input signal, and provides a third amplified signal in the third mode.

25 Claims, 7 Drawing Sheets

MULTI-MODE LOW NOISE AMPLIFIER WITH TRANSFORMER SOURCE DEGENERATION

CLAIM OF PRIORITY UNDER 35 U.S.C. §119

The present Application for Patent claims priority to Provisional U.S. Application Ser. No. 61/227,941, entitled "TRANSFORMER DEGENERATED LOW-NOISE AMPLIFIER," filed Jul. 23, 2009, assigned to the assignee hereof, and expressly incorporated herein by reference.

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

A wireless communication device may support multiple radio technologies and/or multiple frequency bands. The wireless device may need to meet various requirements relating to gain, noise, and linearity for each radio technology in each frequency band. In order to meet these requirements, the wireless device may include a number of amplifiers. Each amplifier may be designed for one or more radio technologies in one or more frequency bands under certain operating scenario. Having a number of amplifiers may increase the cost and size of the wireless device and may also degrade reliability.

DETAILED DESCRIPTION

The word "exemplary" is used herein to mean "serving as an example, instance, or illustration." Any design described herein as "exemplary" is not necessarily to be construed as preferred or advantageous over other designs.

A multi-mode LNA with transformer source degeneration and capable of supporting multiple radio technologies and/or multiple frequency bands is described herein. The multi-mode LNA may be used for various electronics devices such as wireless and wireline communication devices, cellular phones, personal digital assistants (PDAs), handheld devices, wireless modems, laptop computers, cordless phones, broadcast receivers, Bluetooth devices, consumer electronics devices, etc. For clarity, the use of the multi-mode LNA in a wireless communication device, which may be a cellular phone or some other device, is described below.

Figure 1:
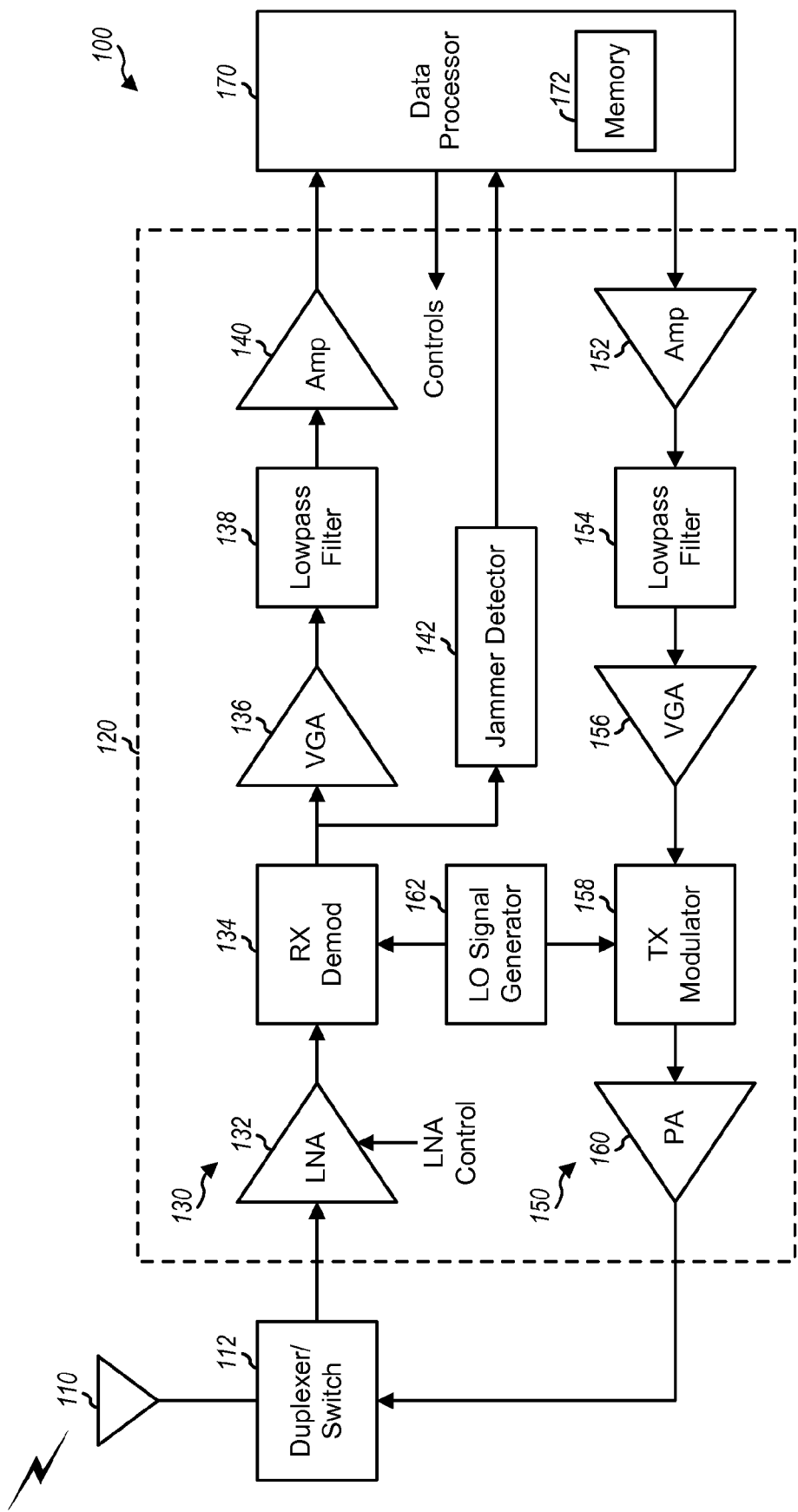
FIG. 1 shows a block diagram of a wireless communication device.

FIG. 1 shows a block diagram of an exemplary design of a wireless communication device 100. In this exemplary design, wireless device 100 includes a transceiver 120 having a transmitter 130 and a receiver 150 that support bi-directional wireless communication. In general, wireless device 100 may include any number of transmitters and any number of receivers for any number of radio technologies and any number of frequency bands.

In the receive path, an antenna 110 receives signals transmitted by base stations and other transmitter stations and provides a received radio frequency (RF) signal, which is routed through a duplexer/switch 112 and provided to receiver 130. Within receiver 130, the received RF signal is amplified by an LNA 132 and demodulated by a receive demodulator (RX Demod) 134 to obtain a downconverted signal. The downconverted signal is amplified by a VGA 136, filtered by a lowpass filter 138, and further amplified by an amplifier (Amp) 140 to obtain an input baseband signal, which is provided to a data processor 170

In the transmit path, data processor 170 processes data to be transmitted and provides an output baseband signal to transmitter 150. Within transmitter 150, the output baseband signal is amplified by an amplifier 152, filtered by a lowpass filter 154 to remove images caused by prior digital-to-analog conversion, amplified by a VGA 156, and modulated by a transmit (TX) modulator 158 to obtain a modulated signal. The modulated signal is amplified by a power amplifier (PA) 160 to obtain the desired output power level, routed through duplexer/switch 112, and transmitted via antenna 110. A local oscillator (LO) signal generator 162 generates downconversion LO signals for demodulator 134 and upconversion LO signals for modulator 158

A jammer detector 142 detects for jammers in the received RF signal based on the downconverted signal from demodulator 134 (or some other signal in the receive path) and provides a jammer indicator. A jammer is an undesired signal that may be much larger in amplitude than a desired signal and may be located close in frequency to the desired signal. Jammer detector 142 may detect for close-in jammers and farther-out jammers, e.g., using filters with different bandwidths. Jammer detection may also be performed based on digital samples obtained by digitizing the input baseband signal from amplifier 140. The operation of LNA 132 and/or other amplifiers may be controlled based on detected jammers. For example, an LNA control may be generated based on detected jammers and used to control the operation of LNA 132.

FIG. 1 shows an exemplary design of transceiver 120. In general, the conditioning of the signals in receiver 130 and transmitter 150 may be performed by one or more stages of amplifier, filter, upconverter, downconverter, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, LNA 132 through amplifier 140 in receiver 130 may be implemented on an RFIC, and other circuits in transceiver 120 may be implemented on the same RFIC or external to the RFIC.

Data processor 170 may perform various functions for wireless device 100, e.g., processing for data being transmitted or received. Data processor 170 may also generate controls (e.g., LNA control) for various circuit blocks in transceiver 120. A memory 172 may store program codes and data for data processor 170. Data processor 170 and memory 172 may be implemented on one or more application specific integrated circuits (ASICs) and other ICs.

Wireless device 100 may support multiple radio technologies such as Code Division Code Division Multiple Access (CDMA) 1×, Wideband CDMA (WCDMA), Global System for Mobile Communications (GSM), Long Term Evolution (LTE), Global Positioning System (GPS), Wi-Fi, etc. Wireless device 100 may also support multiple frequency bands, which may include low band and/or high band. In one exemplary design, low band may cover 420 to 490 megahertz (MHz) and high band may cover 728 to 960 MHz. In another exemplary design, low band may cover cellular and GSM 900 bands, and high band may cover PCS and IMT-2000 bands. Low band and high band may also cover other frequency bands. In some exemplary designs, high band may be approximately twice higher than low band.

As shown in FIG. 1, wireless device 100 may include various amplifiers for a transmitter and a receiver. Wireless device 100 may include multiple instances of a given amplifier in order to support multiple radio technologies and/or multiple frequency bands for all applicable operating scenarios. For example, wireless device 100 may include multiple LNAs, with each LNA being designed for one or more radio technologies in one or more frequency bands for a particular operating scenario. These multiple LNAs may increase the size and cost of wireless device 100.

In an aspect, a multi-mode LNA with transformer source degeneration may be used to support multiple radio technologies and/or multiple frequency bands for various operating scenarios. The multi-mode LNA may support multiple operating modes. Each operating mode may cover one or more radio technologies in one or more frequency bands for a particular operating scenario. In an exemplary design, the multi-mode LNA may support the operating modes shown in Table 1.

TABLE 1

Operating Modes

| Operating Mode | Description |
| --- | --- |
| High band high linearity (HL) mode | Provide higher linearity in high band and applicable when large jammers are present. |
| High band low linearity (LL) mode | Provide better noise performance (e.g., a lower noise figure) in high band and applicable when large jammers are not present. |
| Low band high linearity mode | Provide higher linearity in low band and applicable when large jammers are present. |
| Low band low linearity mode | Provide better noise performance in low band and applicable when large jammers are not present. |

The multi-mode LNA may also support fewer, more and/or different operating modes. For clarity, much of the description below assumes the four operating modes described in Table 1.

Figure 2:
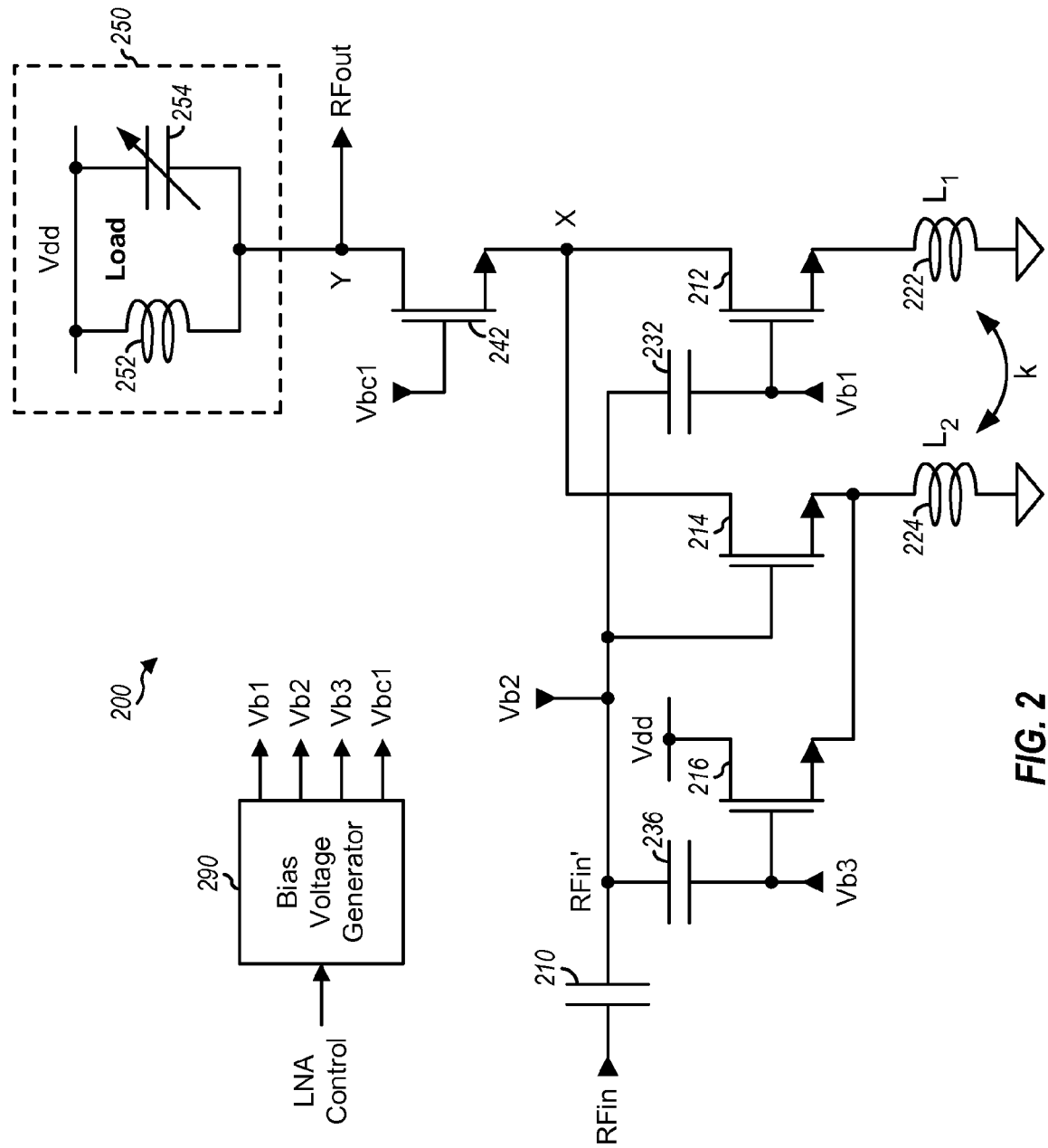
FIG. 2 shows an exemplary design of a multi-mode LNA.

FIG. 2 shows a schematic diagram of an LNA 200, which is an exemplary design of the multi-mode LNA. LNA 200 may be used for LNA 132 in FIG. 1. Within LNA 200, a capacitor 210 has one end receiving an input RF signal, RFin, and the other end receiving a Vb2 bias voltage and providing an AC coupled input RF signal, RFin', having a DC voltage of Vb2. An N-channel metal oxide semiconductor (NMOS) transistor 212 has its gate receiving a Vb1 bias voltage, its source coupled to one end of an inductor 222, and its drain coupled to node X. The other end of inductor 222 is coupled to circuit ground. An NMOS transistor 214 has its gate receiving the RFin' signal, its source coupled to one end of an inductor 224, and its drain coupled to node X. The other end of inductor 224 is coupled to circuit ground. An NMOS transistor 216 has its gate receiving a Vb3 bias voltage, its source coupled to the source of NMOS transistor 214, and its drain coupled to a power supply, Vdd. AC coupling capacitors 232 and 236 have one end receiving the RFin' signal and the other end coupled to the gate of NMOS transistors 212 and 216, respectively. In the exemplary design shown in FIG. 2, the RFin' signal is provided via AC coupling capacitors 232 and 236 to the gate of NMOS transistors 212 and 216 and is provided directly to the gate of NMOS transistor 214. This configuration may improve the noise figure of NMOS transistor 214 and may allow each of NMOS transistors 212, 214 and 216 to be enabled or disabled independently. In another exemplary design, the RFin signal may be provided via an AC coupling capacitor to the gate of each input NMOS transistor. An NMOS transistor 242 has its gate receiving a Vbc1 bias voltage, its source coupled to node X, and its drain coupled to node Y. Node Y provides an output RF signal, RFout.

A load 250 includes an inductor 252 and a variable capacitor 254 coupled in parallel and between the Vdd supply and node Y. Inductor 252 and capacitor 254 form a resonator circuit having a resonant frequency that may be adjusted by varying the capacitance of capacitor 254. The resonant frequency may be set to a frequency channel or band of interest. Load 250 may be used for both high band and low band. Inductor 252 may be a fixed inductor having a fixed inductance and may be designed for high band. Variable capacitor 254 may be adjusted for different operating frequencies in the high band and low band. Variable capacitor 254 may be implemented with (i) a bank of capacitors that may be selected or unselected via digital controls and/or (ii) one or more varactors that may be varied via one or more analog control voltages. Variable capacitor 254 may enable load tuning across both high band and low band, e.g., for frequency bands ranging from 450 MHz to 960 MHz in one exemplary design described above.

NMOS transistor 212 and inductor 222 form a first input gain stage for the RFin signal. NMOS transistor 214 and inductor 224 form a second input gain stage for the RFin signal. NMOS transistor 216 operates as a switch that can select inductor 224 without providing its output to the RFout signal. NMOS transistor 212 may be enabled or disabled based on the Vb1 bias voltage. NMOS transistor 214 may be enabled or disabled based on the DC voltage of the RFin' signal. NMOS transistor 216 may be enabled or disabled based on the Vb3 bias voltage. NMOS transistors 212 and 214 provide signal amplification when enabled. A bias voltage generator 290 may receive the LNA control and generate the bias voltages for the NMOS transistors in LNA 200.

Inductors 222 and 224 provide source degeneration for NMOS transistors 212 and 214, respectively. Inductors 222 and 224 may further provide input impedance matching looking into the gates of NMOS transistors 212 and 214. NMOS transistor 242 is a cascode transistor that provides load isolation for NMOS transistors 212 and 214 and also provides signal drive for the RFout signal.

FIG. 2 shows an exemplary design of multi-mode LNA 200 capable of achieving high linearity and/or low noise figure for high band and low band. LNA 200 may also be implemented in other manners. For example, NMOS transistor 212 and/or 214 may each be replaced with multiple NMOS transistors coupled in parallel. Different numbers of NMOS transistors or different combinations of NMOS transistors may be selected for different gain modes. Load 250 may be replaced with an active load, which may be implemented with P-channel metal oxide semiconductor (PMOS) transistors or some other type of transistors.

Figure 3:
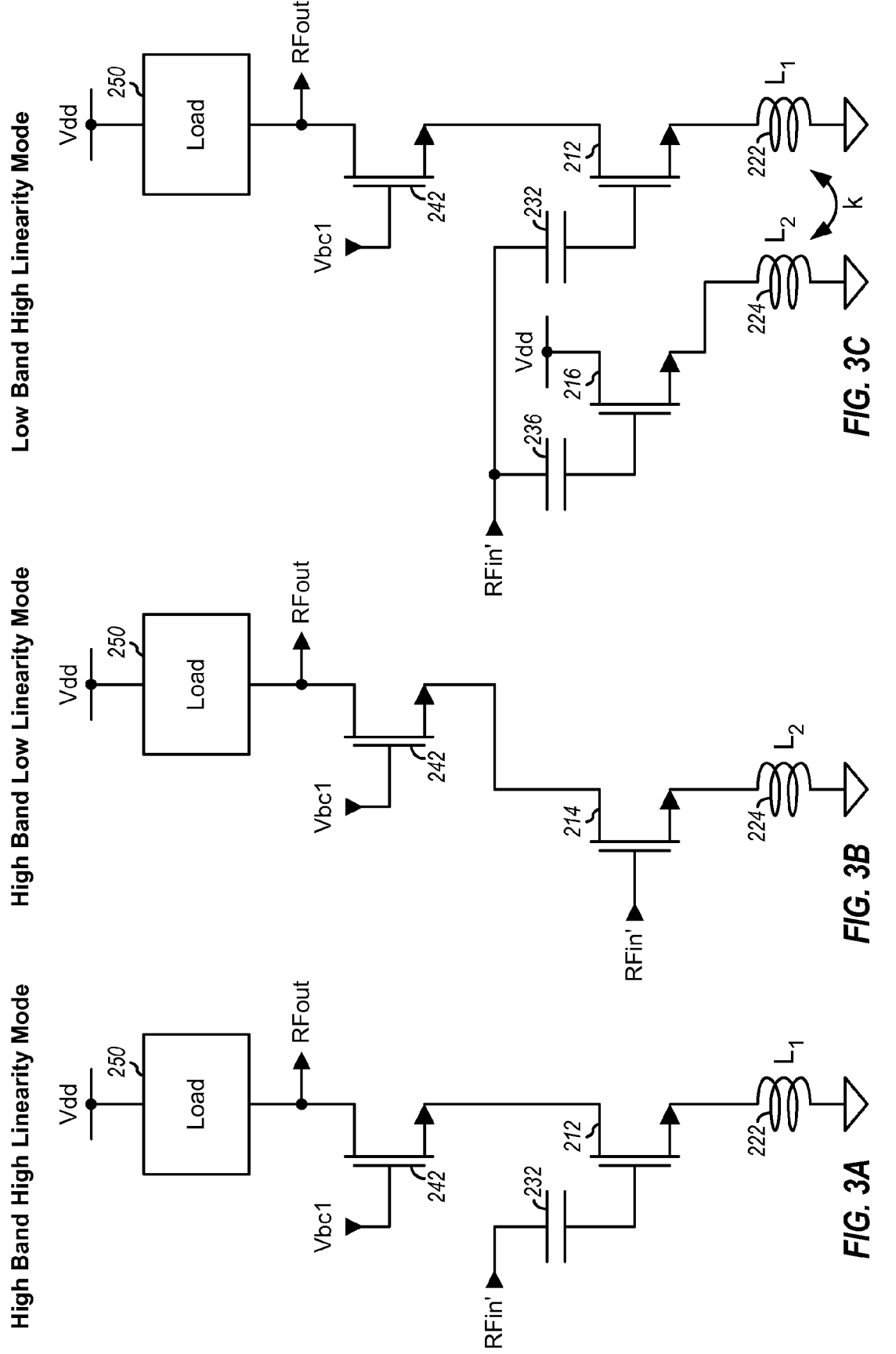
FIGS. 3A, 3B and 3C show operation of the multi-mode LNA in three modes.

FIG. 3A shows operation of LNA 200 in the high band high linearity mode. In this mode, NMOS transistor 212 is enabled, and NMOS transistors 214 and 216 are disabled. The RFin' signal is provided to the first input gain stage comprising NMOS transistor 212 and inductor 222. NMOS transistor 212 may be designed to provide the desired noise performance in the high band. Inductor 222 may have an inductance of $L_1$ and may be designed to provide the desired linearity for the high linearity mode. The desired linearity may be quantified by a target third-order input intercept point (IIP3) or a target triple beat (TB).

FIG. 3B shows operation of LNA 200 in the high band low linearity mode. In this mode, NMOS transistor 214 is enabled, and NMOS transistors 212 and 216 are disabled. The RFin' signal is provided to the second input gain stage comprising NMOS transistor 214 and inductor 224. NMOS transistor 214 may be designed to provide the desired noise performance in the high band. Inductor 224 may have an inductance of $L_2$ and may be designed to provide the desired linearity for the low linearity mode.

FIG. 3C shows operation of LNA 200 in the low band high linearity mode. In this mode, NMOS transistors 212 and 216 are enabled, and NMOS transistor 214 is disabled. The RFin' signal is provided to a third input gain stage comprising NMOS transistor 212 and inductors 212 and 224. NMOS transistor 216 enables inductor 224 but has its drain coupled to the Vdd supply instead of node X. Hence, NMOS transistor 216 does not increase the gain of the third input gain stage relative to the gain of first input gain stage in FIG. 3A, which may be desirable in the high linearity mode.

Inductors 222 and 224 operate as a transformer in the low band high linearity mode shown in FIG. 3C. The mutual inductance M due to coupling between inductors 222 and 224 may be expressed as:

$$M = k \cdot \sqrt{L_1 L_2},\qquad\qquad \text{Eq (1)}$$

where k is a coupling coefficient or factor between inductors 222 and 224, and

M is the mutual inductance.

The coupling coefficient k may be within a range of 0 to 1 (or $0 \leq k \leq 1$) and may be dependent on the layout of inductors 222 and 224 and other factors. The total inductance observed by NMOS transistor 212 due to inductors 222 and 224 may be expressed as:

$$L_{TOTAL} = L_1 + M \qquad\qquad \text{Eq (2)}$$

where $L_{TOTAL}$ is the total inductance observed by NMOS transistor 212.

As shown in equation (2), the total inductance observed by NMOS transistor 212 may be increased by the mutual inductance due to the transformer. The mutual inductance (and hence the amount of increase in inductance) may be dependent on the coupling coefficient k as well as the values of $L_1$ and $L_2$. $L_1$ may be larger than $L_2$ since inductor 222 is used for the high linearity mode in FIG. 3A and inductor 224 is used for the low linearity mode in FIG. 3B. In this case, the total inductance may be less than $2L_1$. The larger total inductance may improve linearity in the low band high linearity mode.

The low band low linearity mode may be implemented in various manners. In an exemplary design, the low band low linearity mode may be implemented with the first input gain stage shown in FIG. 3A. In another exemplary design, the low band low linearity mode may be implemented with the second input gain stage shown in FIG. 3B. The low band low linearity mode may also be implemented in other manners.

FIG. 2 shows an exemplary design in which LNA 200 includes two input gain stages that may be designed to obtain the desired performance for two operating modes, as shown in FIGS. 3A and 3B. A third input gain stage for a third operating mode may be obtained by reusing source degeneration inductors 222 and 224 in the first and second input gain stages. Inductors 222 and 224 may be designed for higher frequency and may have smaller sizes. A larger effective inductor may be obtained for the third input gain stage through transformer effect of the two inductors 222 and 224. The larger effective inductor may enable the third input gain stage to be used for a lower frequency LNA, without having to actually implement a larger inductor at the lower frequency. Reusing inductors 222 and 224 to implement a larger inductor may result in reduced silicon area compared to a design that uses a separate source degeneration inductor for the third input gain stage. This may facilitate integration of a multi-mode multi-band multi-standard receiver on an IC.

LNA 200 may support additional input gain stages and operating modes. For example, a fourth input gain stage may be implemented with NMOS transistors 214 and 216 enabled and NMOS transistors 212 disabled. The fourth input gain stage may then comprise NMOS transistor 214 and inductors 212 and 224. A fifth input gain stage may be implemented with NMOS transistors 212 and 214 enabled and NMOS transistors 216 disabled. The fifth input gain stage may then comprise NMOS transistors 212 and 214 and inductors 212 and 224.

In general, the multi-mode LNA may include N input gain stages, where N may be any integer value greater than one. Each input gain stage may include one or more gain transistors (e.g., one or more NMOS transistors) coupled to a source degeneration inductor. Each input gain stage may be designed for a particular operating mode. One or more additional input gain stages may be implemented by reusing the N input gain stages. Each additional input gain stage may be implemented with multiple input gain stages and may include one or more gain transistors coupled to an effective inductor implemented with multiple inductors in the multiple input gain stages. Different additional input gain stages may be implemented with different pairs of inductors. An additional input gain stage may also be implemented with a transformer formed with three or more inductors to further increase the effective inductance.

Figure 4:
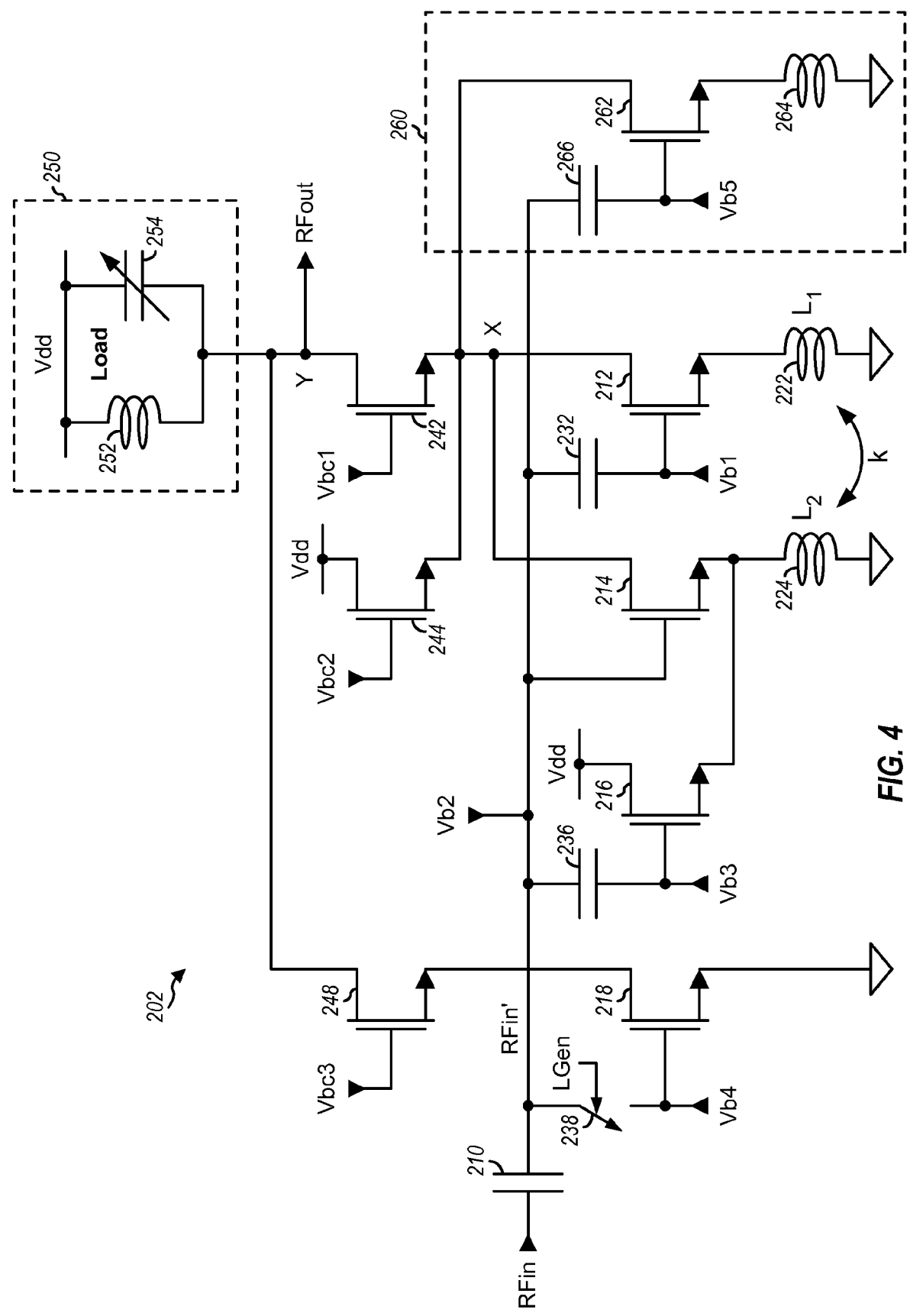
FIG. 4 shows another exemplary design of the multi-mode LNA.

FIG. 4 shows a schematic diagram of an LNA 202, which is another exemplary design of the multi-mode LNA. LNA 202 may also be used for LNA 132 in FIG. 1. LNA 202 includes all circuit components in LNA 200 in FIG. 2. LNA 202 further includes an input gain stage comprising NMOS transistors 218 and 248. NMOS transistor 218 has its source coupled to circuit ground and its gate receiving the RFin' signal via a switch 238. Switch 238 may be implemented with one or more MOS transistors and may be closed or opened by an LGen control signal. NMOS transistor 248 has its source coupled to the drain of NMOS transistor 218, its gate receiving a Vbc3 bias voltage, and its drain coupled to node Y. NMOS transistors 218 and 248 may be used for a low gain mode and may be enabled by (i) closing switch 238 with the LGen control signal and (ii) disabling NMOS transistors 212, 214 and 216 with the Vb1, Vb2 and Vb3 bias voltages. MOS transistor 218 may be disabled by opening switch 238, and MOS transistor 248 may be disabled with the Vbc3 bias voltage.

LNA 202 further includes an additional cascode NMOS transistor 244 having its gate receiving a Vbc2 bias voltage, its source coupled to node X, and its drain coupled to the Vdd supply. NMOS transistor 244 may be enabled in the high linearity mode (e.g., when large jammers are detected) in order to bleed/attenuate part of the RF signal and reduce gain. NMOS transistor 244 may be disabled in the low linearity mode to improve noise performance.

LNA 202 further includes a distortion generation circuit 260 that generates distortion components for intermodulation cancellation. The intermodulation cancellation attempts to cancel distortion components from a selected input gain stage and improve the linearity of LNA 202. Within distortion generation circuit 260, an NMOS transistor 262 has its gate receiving a Vb5 bias voltage, its source coupled to one end of an inductor 264, and its drain coupled to node X. Inductor 264 provides source degeneration for NMOS transistor 262 and has its other end coupled to circuit ground. An AC coupling capacitor 266 has one end receiving the RFin' signal and the other end coupled to the gate of NMOS transistor 262. NMOS transistor 262 may be enabled in the high linearity mode to generate distortion components for intermodulation cancellation. NMOS transistor 262 may be disabled in the low linearity mode to improve noise performance.

In the exemplary design shown in FIGS. 3A to 3C, NMOS transistor 212 provides signal amplification for the RFin signal in the high linearity mode and has nonlinearity. NMOS transistor 262 generates third-order distortion component used to cancel third-order distortion component from NMOS transistor 212 and hence improve linearity. The drain current $i_d$ of NMOS transistor 212 may be represented by a power series as follows:

$$i_d(v_{gs}) = g_1 \cdot v_{gs} + g_2 \cdot v_{gs}^2 + g_3 \cdot v_{gs}^3 + \ldots \quad (3)$$

where $g_1$ is a coefficient for the small-signal transconductance of NMOS transistor 212, $g_2$ is a coefficient that defines the strength of second-order nonlinearity, $g_3$ is a coefficient that defines the strength of third-order nonlinearity, $v_{gs}$ is a gate-to-source voltage of NMOS transistor 212, and $i_d(v_{gs})$ is the drain current of NMOS transistor 212 as a function of $v_{gs}$.

For simplicity, nonlinearities higher than third order are ignored in equation (3). Coefficients $g_1$, $g_2$ and $g_3$ are determined by the device size and the bias current for NMOS transistor 212. The Vb1 bias voltage may be set to obtain a desired bias current for NMOS transistor 212. Coefficient $g_3$ controls the third-order intermodulation distortion (IMD3) at low signal level and hence determines the IIP3 of LNA 202.

Similarly, the drain current of NMOS transistor 262 is a function of the RFin signal and may be represented by the power series shown in equation (3). For intermodulation cancellation, a positive $g_3$ coefficient with a particular $g_3$ curvature for NMOS transistor 212 may be canceled with a negative $g_3$ coefficient with a mirrored $g_3$ curvature for NMOS transistor 262. The Vb5 bias voltage and/or the dimension of NMOS transistor 262 may be selected to obtain the desired $g_3$ coefficient and curvature for NMOS transistor 262. Inductor 264 allows for adjustment of the magnitude and phase of the third-order distortion component from NMOS transistor 262 to match the magnitude and phase of the third-order distortion component from NMOS transistor 212.

Figure 5:
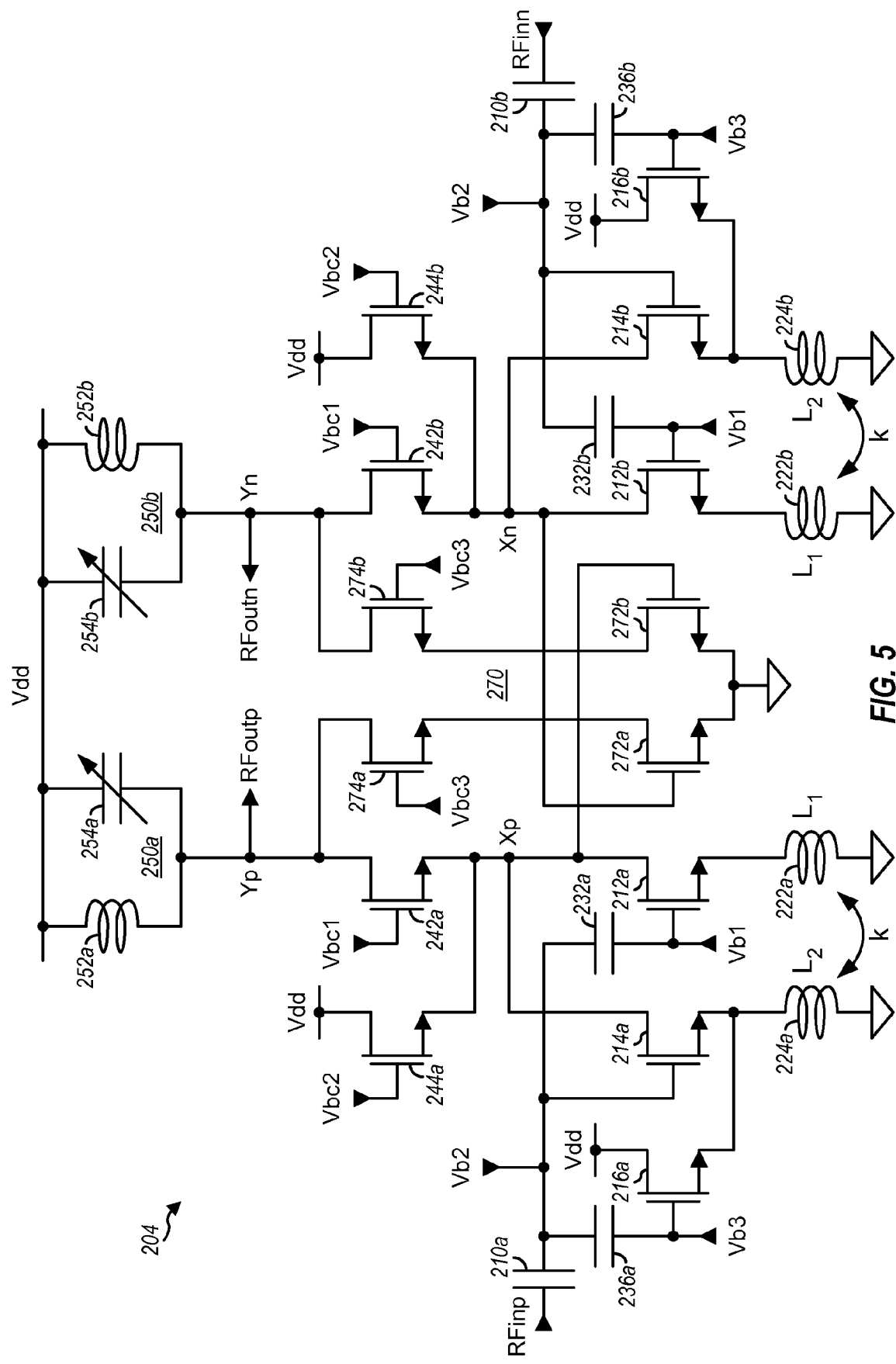
FIG. 5 shows an exemplary differential design of the multi-mode LNA.

FIG. 5 shows a schematic diagram of an LNA 204, which is an exemplary differential design of the multi-mode LNA. LNA 204 may also be used for LNA 132 in FIG. 1. LNA 204 includes NMOS transistors 212a, 214a, 216a, 242a and 244a, inductors 222a and 224a, capacitors 232a and 236a, and load 250a for half of the differential LNA, which are coupled in similar manner as NMOS transistors 212, 214, 216, 242 and 244, inductors 222 and 224, capacitors 232 and 236, and load 250, respectively, in FIG. 4. LNA 204 further includes NMOS transistors 212b, 214b, 216b, 242b and 244b, inductors 222b and 224b, capacitors 232b and 236b, and load 250b for a complementary half of the LNA, which are also coupled in similar manner as NMOS transistors 212, 214, 216, 242 and 244, inductors 222 and 224, capacitors 232 and 236, and load 250, respectively, in FIG. 2.

LNA 204 receives a differential input RF signal comprising an RFinp signal and an RFinn signal and provides a differential output RF signal comprising an RFoutp signal and an RFoutn signal. The RFinp signal is provided via AC coupling capacitors to the gates of NMOS transistors 212a, 214a and 216a. The RFinn signal is provided via AC coupling capacitors to the gates of NMOS transistors 212b, 214b and 216b. The RFoutp signal is provided by the drain of NMOS transistor 242a. The RFoutn signal is provided by the drain of NMOS transistor 242b.

LNA 204 further includes a distortion generation circuit 270 that generates distortion components for intermodulation cancellation. Within distortion generation circuit 270, NMOS transistors 272a and 272b are coupled as a differential pair and have their sources coupled to circuit ground and their gates coupled to nodes Xn and Xp, respectively. NMOS transistors 274a and 274b are cascode transistors and have their gates receiving a Vbc3 bias voltage, their sources coupled to the drains of NMOS transistors 272a and 272b, respectively, and their drains coupled to nodes Yp and Yn, respectively. The Vbc3 bias voltage and the dimensions of NMOS transistors 272a, 272b, 274a and 274b may be selected to obtain the desired distortion components for intermodulation cancellation. Distortion generation circuit 270 may be enabled in the high linearity mode and may be disabled in the low linearity mode.

The multi-mode LNA may operate in a high linearity mode or a low linearity mode at any given moment. The high linearity mode may be used to obtain high linearity for the LNA and may be selected when greater linearity is desired to reduce cross modulation distortion. The low linearity mode may be used to obtain better noise performance (e.g., a lower noise figure) for the LNA and may be selected when high linearity is not required and better noise performance is desired. In an exemplary design, the high or low linearity mode may be selected based on jammer level. The high linearity mode may be selected if the jammer level exceeds a TH1 threshold, and the low linearity mode may be selected if the jammer level falls below a TH2 threshold. TH1 may be higher than TH2 to provide hysteresis and avoid continually toggling between the high and low linearity modes when the jammer level fluctuates near the TH1 or TH2 threshold. The high or low linearity mode may also be selected based on other factors.

In general, any number of operating modes may be supported by the multi-mode LNA. Each operating mode may be associated with an input gain stage that can provide the desired performance (e.g., higher linearity and/or lower noise figure) for that operating mode. Different operating modes may also be associated with different amounts of bias current for the transistors within the LNA. For example, more bias current may be used for operating modes requiring higher linearity. An operating mode may be selected for the LNA based on jammer level and/or other factors.

The source degeneration inductors may be implemented in various manners. It may be desirable to implement the inductors in as small an area as possible and to obtain the desired coupling between the inductors.

Figure 6:
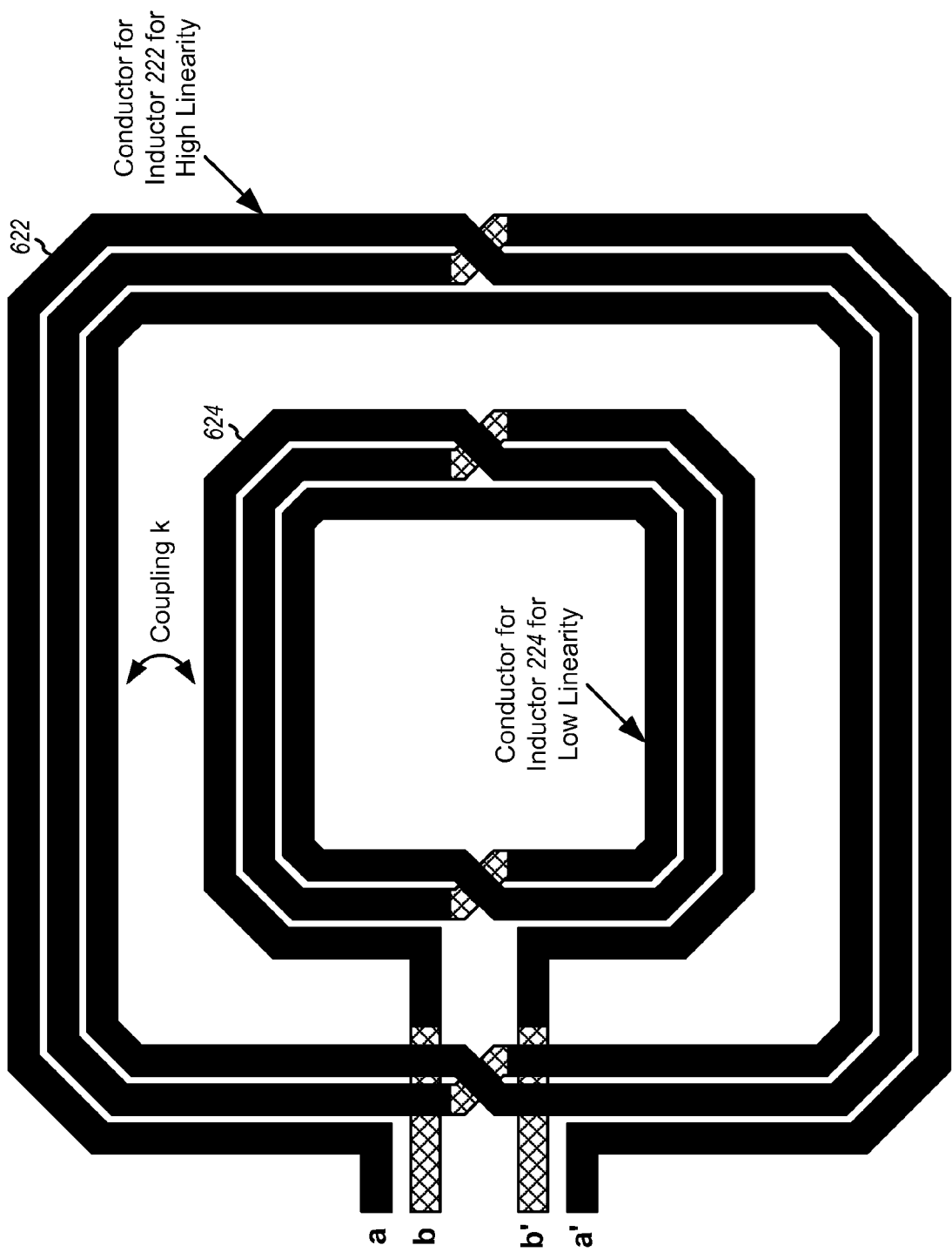
FIG. 6 shows an exemplary design of two inductors in the multi-mode LNA.

FIG. 6 shows a top view of an exemplary design of inductors 222 and 224 in FIG. 2. In this exemplary design, a conductor 622 implements inductor 222 for the high linearity mode and has two ends a and a', which correspond to the two ends of inductor 222. A conductor 624 implements inductor 224 for the low linearity mode and has two ends b and b', which correspond to the two ends of inductor 224. For each conductor, the dark shaded part shows the conductor on one metal layer, and the cross-hashed part shows underpass on another metal layer. In the exemplary design shown in FIG. 6, each inductor is implemented with three turns. Larger turns are used for conductor 622 to obtain larger inductance for inductor 222. Conductor 624 may be implemented within the center area inside of conductor 622 in order to save area, as shown in FIG. 6. Other circuit components (e.g., NMOS transistors and capacitors) may be implemented within conductor 622 and/or outside of conductor 622.

FIG. 6 shows an exemplary layout of conductors 622 and 624 for inductors 222 and 224, respectively. The conductors for the inductors may also be implemented with other patterns instead of spiral patterns. For example, each conductor may be implemented with a double spiral, zig-zag, or some other pattern. In general, different topologies, layout patterns, and IC fabrication processes may provide different advantages for the inductors. The layout of conductors 622 and 624 may take into account various considerations. For example, the spacing between conductors 622 and 624 may be selected to obtain the desired coupling and mutual inductance between inductors 222 and 224. More spacing may result in less mutual inductance, and vice versa.

Conductors 622 and 624 may be fabricated with various conductive materials such as a low-loss metal (e.g., copper), a more lossy metal (e.g., aluminum), or some other material. Higher quality factor (Q) may be achieved for an inductor fabricated on a low-loss metal layer. A smaller-size inductor may be fabricated on a lossy metal layer because different IC design rules may apply. In an exemplary design, conductor 624 is fabricated inside of conductor 622, e.g., as shown in FIG. 6. In another exemplary design, conductors 622 and 624 are fabricated with overlapping parallel conductors formed on top of one another on different metal layers (not shown in FIG. 6).

For clarity, the techniques of reusing source degeneration inductors for multiple input gain stages to implement one or more larger effective inductors for one or more additional input gain stages have been described for an LNA. The techniques may also be used for other type of amplifiers.

In an exemplary design, an apparatus may comprise first, second, and third transistors and first and second inductors. The first transistor (e.g., NMOS transistor 212 in FIG. 2) may have a source coupled to the first inductor (e.g., inductor 222). The first transistor may amplify an input signal and provide a first amplified signal in a first mode, e.g., as shown in FIG. 3A. The second transistor (e.g., NMOS transistor 214) may have a source coupled to the second inductor (e.g., inductor 224). The second transistor may amplify the input signal and provide a second amplified signal in a second mode, e.g., as shown in FIG. 3B. The third transistor (e.g., NMOS transistor 216) may have a source coupled to the second inductor. The first and third transistors may receive the input signal and conduct current through the first and second inductors, respectively, in a third mode. The first transistor may observe source degeneration from a transformer formed by the first and second inductors in the third mode, e.g., as shown in FIG. 3C. The first transistor may observe larger source degeneration inductance in the third mode than the first mode due to the transformer. The first transistor may amplify the input signal and provide a third amplified signal in the third mode. The third transistor may have a drain coupled to a power supply and may not provide the third amplified signal in the third mode.

In an exemplary design, the first and second modes may be for high band, and the third mode may be for low band. The first and third modes may be for high linearity, and the second mode may be for low linearity. For example, the first mode may be a high band high linearity mode, the second mode may be a high band low linearity mode, and the third mode may be a low band high linearity mode.

The apparatus may include additional transistors and/or may support additional modes. For example, the apparatus may include a fourth transistor (e.g., NMOS transistor 218 in FIG. 4) having a source coupled to circuit ground. The fourth transistor may amplify the input signal and provide a fourth amplified signal in a fourth mode, e.g., a low gain mode. The apparatus may further include a transistor (e.g., NMOS transistor 262) that may receive the input signal or an amplified signal and generate distortion component (e.g., third-order distortion component) used to cancel distortion component from the first transistor in the first and/or third mode. Intermodulation cancellation may be enabled in only the first mode, or only the third mode, or both the first and third modes, or some other mode or combination of modes.

The apparatus may include other circuit components. For example, the apparatus may further include a first cascode transistor (e.g., NMOS transistor 242 in FIG. 2) having a source coupled to the drains of the first and second transistors. The first cascode transistor may receive the first, second, or third amplified signal and provide an output signal. The apparatus may further include a second cascode transistor (e.g., NMOS transistor 244 in FIG. 4) having a drain coupled to the power supply and a source coupled to the drains of the first and second transistors. The second cascode transistor may attenuate the first, second, or third amplified signal when enabled. The apparatus may further include a load inductor and a load capacitor coupled in parallel and to the drain of the first cascode transistor. The load inductor may have a fixed inductance. The load capacitor may have a variable capacitance that may be adjusted based on a selected operating frequency.

The set of transistors and inductors described above may be used for a single-ended design, e.g., as shown in FIGS. 2 and 4. For a differential design, the apparatus may further include a second set of transistors and inductors that may be coupled in similar manner as the first set of transistors and inductors, e.g., as shown in FIG. 5. The first set of transistors and inductors may receive the input signal and provide the output signal. The second of transistors and inductors may receive a complementary input signal and provide a complementary output signal.

The apparatus may further include a jammer detector and a processor, e.g., as shown in FIG. 1. The jammer detector may detect for jammers in the input signal. The processor may select one of a plurality of modes, which may include the first, second, and third modes, based on detected jammers in the input signal.

In an exemplary design, the apparatus may be an integrated circuit. The transistors and inductors may be implemented on the integrated circuit. The first inductor may be implemented with a first conductor of at least one turn. The second inductor may be implemented with a second conductor of at least one turn formed within the first conductor, e.g., as shown in FIG.

6. In another exemplary design, the apparatus may be a wireless communication device, a circuit board, a module, etc.

In another exemplary design, a wireless communication device may comprise an antenna providing an input RF signal and an LNA amplifying the input RF signal and providing an output RF signal. The LNA may comprise first, second, and third transistors and first and second inductors, which may be coupled and operated as described above. The LNA may include other circuit components, as also described above.

Figure 7:
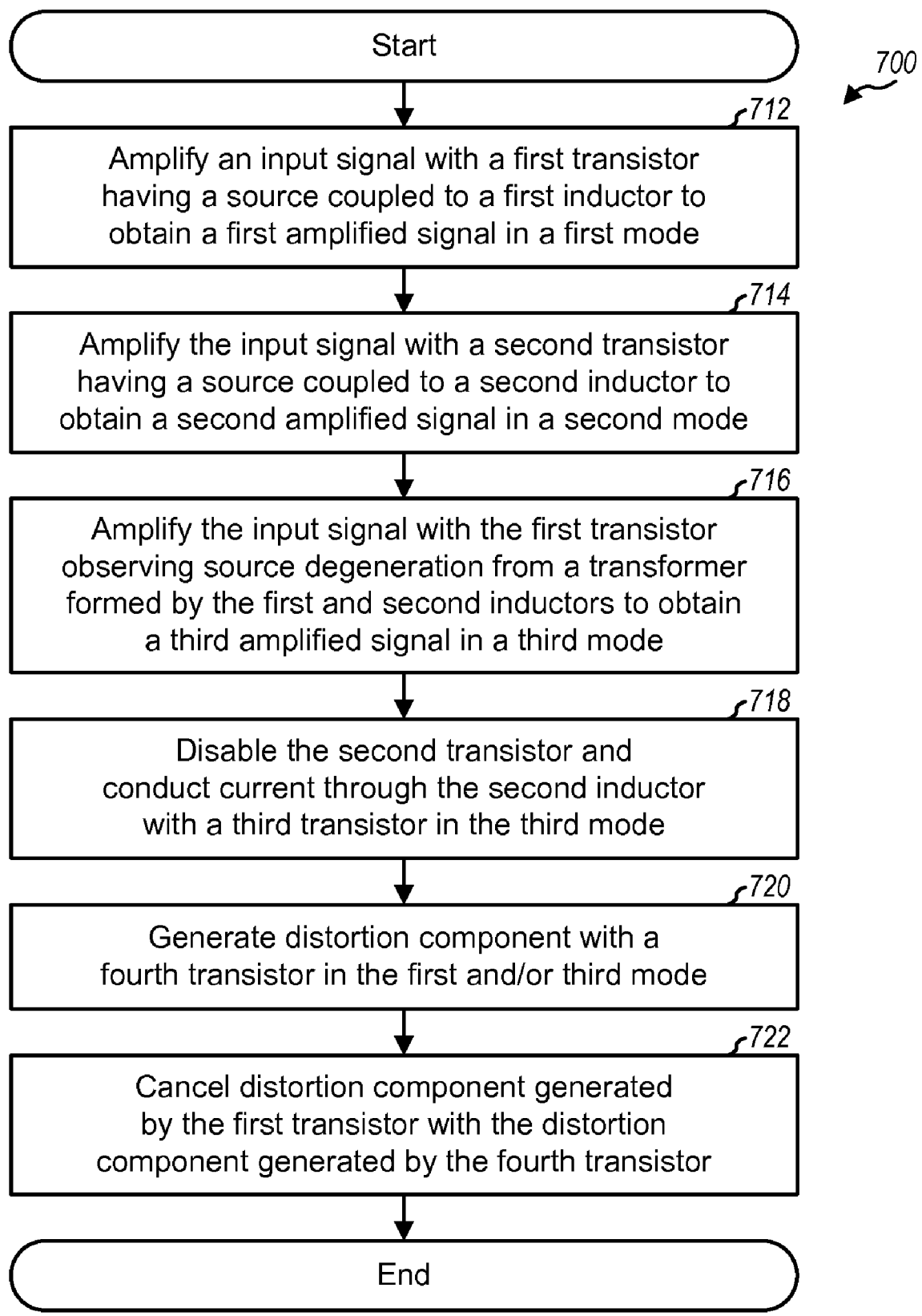
FIG. 7 shows a process for performing signal amplification.

FIG. 7 shows an exemplary design of a process 700 for performing signal amplification. An input signal may be amplified with a first transistor having a source coupled to a first inductor to obtain a first amplified signal in a first mode (block 712). The input signal may be amplified with a second transistor having a source coupled to a second inductor to obtain a second amplified signal in a second mode (block 714). The input signal may be amplified with the first transistor observing source degeneration from a transformer formed by the first and second inductors to obtain a third amplified signal in a third mode (block 716). The second transistor may be disabled, and current may be conducted through the second inductor with a third transistor in the third mode (block 718). The third transistor may not provide the third amplified signal in the third mode. Distortion component may be generated with a fourth transistor in the first and/or third mode (block 720). Distortion component generated by the first transistor may be canceled with the distortion component generated by the fourth transistor (block 722).

A plurality of modes including the first, second, and third modes may be supported. Jammers in the input signal may be detected. One of the plurality of modes may be selected based on detected jammers in the input signal. A mode may also be selected based on other information.

The multi-mode LNA described herein may be able to satisfy demanding linearity, noise, and gain requirements across different radio technologies and frequency bands for different operating scenarios (e.g., with different received jammer levels). The multi-mode LNA may include multiple input gain stages with source degeneration inductors to obtain good linearity and sufficient selectivity at desired frequencies. The multi-mode LNA may reuse the source degeneration inductors to implement one or more larger effective inductors for one or more additional input gain stages. The multi-mode LNA may be able to reduce the number of required inductors and hence reduce size and cost. The multi-mode LNA may be especially advantageous when a number of radio technologies and/or a number of frequency bands are supported. The multi-mode LNA may also be advantageous for low frequency operation, which typically require larger inductors.

The multi-mode LNA may share a common load (e.g., inductor 252 and capacitor 254) for different radio technologies and frequency bands. The multi-mode LNA may include a single distortion generation circuit 270 for intermodulation cancellation. The multi-mode LNA may also have a common downconversion signal path. The common load and common downconversion signal path may reduce silicon area and provide other benefits.

The multi-mode LNA may be able to achieve significant area reduction by taking source degeneration inductors designed for high band operation, boosting the inductance through transformer effect between the inductors, and reusing the inductors for low band operation. Further area and complexity reduction may be achieved by sharing cascode transistors, load, and intermodulation cancellation circuit for both high band and low band.

The multi-mode LNA described herein may be implemented on an IC, an analog IC, an RFIC, a mixed-signal IC, an ASIC, a printed circuit board (PCB), an electronics device, etc. The multi-mode LNA may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the multi-mode LNA described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first transistor having a source coupled to a first inductor, the first transistor amplifying an input signal and providing a first amplified signal in a first mode;
a second transistor having a source coupled to a second inductor, the second transistor amplifying the input signal and providing a second amplified signal in a second mode; and a third transistor having a source coupled to the second inductor, the first and third transistors receiving the input signal and conducting current through the first and second inductors, respectively, in a third mode, the first transistor observing source degeneration from a transformer formed by the first and second inductors, amplifying the input signal, and providing a third amplified signal in the third mode.

2. The apparatus of claim 1, the first transistor observing larger source degeneration inductance in the third mode than the first mode due to the transformer.

3. The apparatus of claim 1, the third transistor having a drain coupled to a power supply and not providing the third amplified signal in the third mode.

4. The apparatus of claim 1, the first and second modes being for high band, and the third mode being for low band.

5. The apparatus of claim 1, the first and third modes being for high linearity, and the second mode being for low linearity.

6. The apparatus of claim 1, further comprising:
a first cascode transistor having a source coupled to drains of the first and second transistors, the first cascode transistor receiving the first, second, or third amplified signal and providing an output signal.

7. The apparatus of claim 6, further comprising:
a second cascode transistor having a drain coupled to a power supply and a source coupled to the drains of the first and second transistors, the second cascode transistor attenuating the first, second, or third amplified signal when enabled.

8. The apparatus of claim 6, further comprising:
a load inductor and a load capacitor coupled in parallel and to a drain of the first cascode transistor.

9. The apparatus of claim 8, the load inductor having a fixed inductance, and the load capacitor having a variable capacitance adjusted based on a selected operating frequency.

10. The apparatus of claim 1, further comprising:
a fourth transistor having a source coupled to circuit ground, the fourth transistor amplifying the input signal and providing a fourth amplified signal in a fourth mode.

11. The apparatus of claim 1, further comprising:
a fourth transistor receiving the input signal and generating distortion component used to cancel distortion component from the first transistor in the first mode, or the third mode, or both.

12. The apparatus of claim 1, further comprising:
a fourth transistor having a source coupled to a third inductor, the fourth transistor amplifying a complementary input signal and providing a complementary first amplified signal in the first mode;
a fifth transistor having a source coupled to a fourth inductor, the fifth transistor amplifying the complementary input signal and providing a complementary second amplified signal in the second mode; and
a sixth transistor having a source coupled to the fourth inductor, the fourth and sixth transistors receiving the complementary input signal and conducting current through the third and fourth inductors, respectively, in the third mode, the fourth transistor observing source degeneration from a second transformer formed by the third and fourth inductors, amplifying the complementary input signal, and providing a complementary third amplified signal in the third mode.

13. The apparatus of claim 12, the third and sixth transistors having drain coupled to a power supply and not providing the third amplified signal and the complementary third amplified signal in the third mode.

14. The apparatus of claim 12, further comprising:
a first cascode transistor having a source coupled to drains of the first and second transistors, the first cascode transistor receiving the first, second, or third amplified signal and providing an output signal; and
a second cascode transistor having a source coupled to drains of the fourth and fifth transistors, the second cascode transistor receiving the complementary first, second, or third amplified signal and providing a complementary output signal.

15. The apparatus of claim 12, further comprising:
a seventh transistor generating distortion component used to cancel distortion component from the first transistor in the first mode, or the third mode, or both; and
an eight transistor generating distortion component used to cancel distortion component from the fourth transistor in the first mode, or the third mode, or both.

16. The apparatus of claim 1, the first inductor being implemented with a first conductor of at least one turn, and the second inductor being implemented with a second conductor of at least one turn and formed within the first conductor.

17. The apparatus of claim 1, further comprising:
a jammer detector detecting for jammers in the input signal; and
a processor selecting one of a plurality of modes including the first, second, and third modes based on detected jammers in the input signal.

18. The apparatus of claim 1, the apparatus being an integrated circuit, the first, second, and third transistors and the first and second inductors being implemented on the integrated circuit.

19. A wireless communication device comprising:
an antenna providing an input radio frequency (RF) signal; and
a low noise amplifier (LNA) amplifying the input RF signal and providing an output RF signal, the LNA comprising:
a first transistor having a source coupled to a first inductor, the first transistor amplifying the input RF signal and providing a first amplified RF signal in a first mode,
a second transistor having a source coupled to a second inductor, the second transistor amplifying the input RF signal and providing a second amplified RF signal in a second mode, and
a third transistor having a source coupled to the second inductor, the first and third transistors receiving the input RF signal and conducting current through the first and second inductors, respectively, in a third mode, the first transistor observing source degeneration from a transformer formed by the first and second inductors, amplifying the input RF signal, and providing a third amplified RF signal in the third mode.

20. The wireless communication device of claim 19, the first transistor observing larger source degeneration inductance in the third mode than the first mode due to the transformer, and the third transistor not providing the third amplified signal in the third mode.

21. A method of performing signal amplification, comprising:
amplifying an input signal with a first transistor having a source coupled to a first inductor to obtain a first amplified signal in a first mode;
amplifying the input signal with a second transistor having a source coupled to a second inductor to obtain a second amplified signal in a second mode, wherein one of the first and second transistors is differently coupled to the input signal; and amplifying the input signal with the first transistor observing source degeneration from a transformer formed by the first and second inductors to obtain a third amplified signal in a third mode.

22. The method of claim 21, further comprising:
disabling the second transistor and conducting current through the second inductor with a third transistor in the third mode, the third transistor not providing the third amplified signal in the third mode.

23. The method of claim 22, further comprising:
generating distortion component with a fourth transistor in the first mode, or the third mode, or both; and
canceling distortion component generated by the first transistor with the distortion component generated by the fourth transistor.

24. The method of claim 21, further comprising:
detecting for jammers in the input signal; and
selecting one of a plurality of modes including the first, second, and third modes based on detected jammers in the input signal.

25. An apparatus comprising:
means for amplifying an input signal with source degeneration by a first inductor to obtain a first amplified signal in a first mode;
means for amplifying the input signal with source degeneration by a second inductor to obtain a second amplified signal in a second mode, wherein one of the first and second transistors is differently coupled to the input signal; and
means for amplifying the input signal with source degeneration by a transformer formed by the first and second inductors to obtain a third amplified signal in a third mode.

* * * * *